(12) United States Patent
Lee et al.

(10) Patent No.: US 10,803,807 B2
(45) Date of Patent: Oct. 13, 2020

(54) DISPLAY DEVICE HAVING CHARGING RATIO COMPENSATOR AND METHOD FOR IMPROVING IMAGE QUALITY THEREOF

(71) Applicant: Samsung Display Co., Ltd., Yongin-si (KR)

(72) Inventors: Jae Hoon Lee, Seoul (KR); Seokha Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/402,125

(22) Filed: May 2, 2019

(65) Prior Publication Data

US 2020/0020277 A1  Jan. 16, 2020

(30) Foreign Application Priority Data

Jul. 13, 2018  (KR) .......................... 10-2018-0081880

(51) Int. Cl.
| | | |
|---|---|---|
| *G09G 3/30* | (2006.01) | |
| *G09G 3/3258* | (2016.01) | |
| *G09G 3/3233* | (2016.01) | |
| *H01L 27/32* | (2006.01) | |
| *H01L 51/52* | (2006.01) | |

(52) U.S. Cl.
CPC ......... *G09G 3/3258* (2013.01); *G09G 3/3233* (2013.01); *H01L 27/3276* (2013.01); *H01L 51/5206* (2013.01); *G09G 2310/08* (2013.01)

(58) Field of Classification Search
CPC ..................... G09G 3/30–3291; G06F 3/12–14
See application file for complete search history.

(56) References Cited

U.S. PATENT DOCUMENTS

2010/0245331 A1* 9/2010 Shirouzu .............. G09G 3/3233
                                                      345/212
2014/0267215 A1* 9/2014 Soni ..................... G09G 3/3233
                                                      345/212

(Continued)

FOREIGN PATENT DOCUMENTS

| KR | 10-2016-0141266 | 12/2016 |
| KR | 10-2017-0118286 | 10/2017 |

*Primary Examiner* — Sanghyuk Park
(74) *Attorney, Agent, or Firm* — H.C. Park & Associates

(57) ABSTRACT

A display device includes a display panel having a plurality of first and second scan lines, a plurality of data lines, a plurality of sensing lines, and a plurality of pixels, a data driver to apply a reference data voltage to the data lines and change the voltage level of the reference data voltage based on a compensating data, a scan driver to apply a first scan voltage to the first scan lines and a second scan voltage to the second scan lines, a timing controller to generate control signals that control the data driver and the scan driver, and a charging ratio compensator to sense a target voltage charged in a first pixel of the plurality of pixels to which the reference data voltage is provided during a predetermined target time, sense a charging voltage charged in the first pixel to which the reference data voltage is provided during a charging time, and output the compensating data that changes a voltage level of the reference data voltage applied to the pixel during the charging time until the difference between the target voltage and the charging voltage is substantially equal to or less than a predetermined reference value.

18 Claims, 8 Drawing Sheets

(56) References Cited

U.S. PATENT DOCUMENTS

| | | |
|---|---|---|
| 2015/0243213 A1 | 8/2015 | Ryu et al. |
| 2016/0203764 A1* | 7/2016 | In .................. G09G 3/3225 345/215 |

* cited by examiner

DISPLAY DEVICE HAVING CHARGING RATIO COMPENSATOR AND METHOD FOR IMPROVING IMAGE QUALITY THEREOF

CROSS-REFERENCE TO RELATED APPLICATION

This application claims priority from and the benefit of Korean Patent Application No. 10-2018-0081880, filed on Jul. 13, 2018, which is hereby incorporated by reference for all purposes as if fully set forth herein.

BACKGROUND

Field

Exemplary implementations of the invention relate generally to a display device, and more specifically, to a display device and a method for improving the image quality thereof.

Discussion of the Background

Recently, flat panel display (FPD) devices have been widely used as a display device for electronic devices because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. The OLED devices have been spotlighted as next-generation display devices because the OLED devices have various advantages such as a wide viewing angle, a rapid response speed, a thin thickness, low power consumption, etc.

Each of pixels in the OLED device may include an organic light emitting diode and a pixel circuit for driving the organic light emitting diode. The pixel circuit may include a switching transistor that transfers a data voltage to a storage capacitor, which stores the data voltage, a driving transistor that controls a driving current based on the voltage charged in the storage capacitor, etc. The time for charging the data voltage may decrease as the resolution and driving frequency of the OLED device increase. When the charging time of the pixel decreases, the charging ratio of the actual charging voltage to the desired target voltage may decrease. Thus, the display quality may be degraded.

The above information disclosed in this Background section is only for understanding of the background of the inventive concepts, and, therefore, it may contain information that does not constitute prior art.

SUMMARY

Display devices and methods constructed according to the principles and exemplary implementations of the invention are capable of improving image quality by compensating the charging ratio of the pixels. For example, compensating the charging ratio of a pixel may occur by adding a sensing transistor and scan line to each pixel to sense the target voltage applied to the pixel during the target time and the charging voltage applied to the pixel during the charging time, and generating correction data voltage to compensate the charging ratio of the pixel as the voltage level of the reference data voltage changes until the difference between the target voltage and the charging voltage is equal to or less than the reference value.

Additional features of the inventive concepts will be set forth in the description which follows, and in part will be apparent from the description, or may be learned by practice of the inventive concepts.

According to one aspect of the invention, a display device includes a display panel having a plurality of first and second scan lines, a plurality of data lines, a plurality of sensing lines, and a plurality of pixels, a data driver to apply a reference data voltage to the data lines and change the voltage level of the reference data voltage based on compensating data, a scan driver to apply a first scan voltage to the first scan lines and a second scan voltage to the second scan lines, a timing controller configured to generate control signals that control the data driver and the scan driver, and a charging ratio compensator to sense a target voltage charged in a first pixel of the plurality of pixels to which the reference data voltage is provided during a predetermined target time, sense a charging voltage charged in the first pixel to which the reference data voltage is provided during a charging time, and output the compensation data that changes a voltage level of the reference data voltage applied to the pixel during the charging time until the difference between the target voltage and the charging voltage is substantially equal to or less than a predetermined reference value.

The charging time may be substantially the same as a data writing time of a horizontal period, and the target time may be longer than the charging time.

The charging ratio compensator may store the reference data voltage as a correction data voltage when the difference of the target voltage and the charging voltage is less than the reference value.

The charging ratio compensator may include a sensor to sense the target voltage and the charging voltage through the sensing line, a calculator to compare the difference of the target voltage and the charging voltage to the reference value, a controller to output the compensating data based on a comparing result of the difference between the target voltage and the charging voltage to the reference value, and a storage unit to store a correction data voltage based on the comparing result of the difference between the target voltage and the charging voltage to the reference value.

The controller may output the compensating data that changes the voltage level of the reference data voltage applied during the charging time when the difference of the target voltage and the charging voltage is substantially equal to or greater than the reference value.

The storage unit may store the reference data voltage as the correction data voltage when the difference of the target voltage and the charging voltage is less than the reference value.

The storage unit may store the correction data voltage corresponding to at least some grayscales.

The first pixel may include a plurality of sub-pixels, and the sub-pixels are coupled to the same sensing line.

The first pixel may include a switching transistor to transfer a data voltage based on the first scan signal, a storage capacitor to store the data voltage, a driving transistor to generate a driving current based on the data voltage, an organic light emitting diode configured to emit light based on the driving current, and a sensing transistor coupled between the storage capacitor and the sensing line, the sensing transistor configured to turns on or turns off based on the second scan signal.

The data line and a gate electrode of the driving transistor may be initialized in a first initialization period and an anode electrode of the organic light emitting diode is initialized during a second initialization period.

The switching transistor may be configured to turn on during the first initialization period, the sensing transistor may be configured to turn on during the second initialization period, and a predetermined initialization voltage may be applied through the data line during the first initialization period and the second initialization period.

The reference data voltage may be applied to the pixel through the data line during a first data writing time that is substantially the same as the target time, and the reference voltage may be applied to the first pixel through the data line during a second data writing time that is substantially the same as the charging time.

The switching transistor may be configured to turn on during the first data writing period and the second data writing period, and the reference data voltage may be applied through the data line during the first data writing period and the second data writing period.

The charging ratio compensator may be configured to sense the target voltage and the charging voltage charged in the storage capacitor through the sensing line during a sensing period.

The switching transistor may be configured to turn off during the sensing period.

The charging ratio compensator may be configured to operate when power to the display device turns off.

According to another aspect of the invention, a method for improving image quality of a display device includes the steps of: applying a predetermined reference data voltage to pixels included in a display panel during a predetermined target time, sensing a target voltage charged in the pixels, applying the reference data voltage to the pixels during a charging time, sensing a charging voltage charged in the pixel, comparing a difference between the target voltage and the charging voltage to a predetermined reference value, outputting a compensating data that changes a voltage level of the reference data voltage applied during the charging time when the difference between the target voltage and the charging voltage is substantially equal to or greater than the reference value, and storing the reference data voltage as a correction data voltage when the difference between the target voltage and the charging voltage is less than the reference value.

The method for improving image quality of the display device may further include a step of initializing the pixels.

The charging time may be substantially the same as a data writing time of a horizontal period, and the target time may be longer than the charging time.

Correction data voltages corresponding to each grayscale may be stored.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
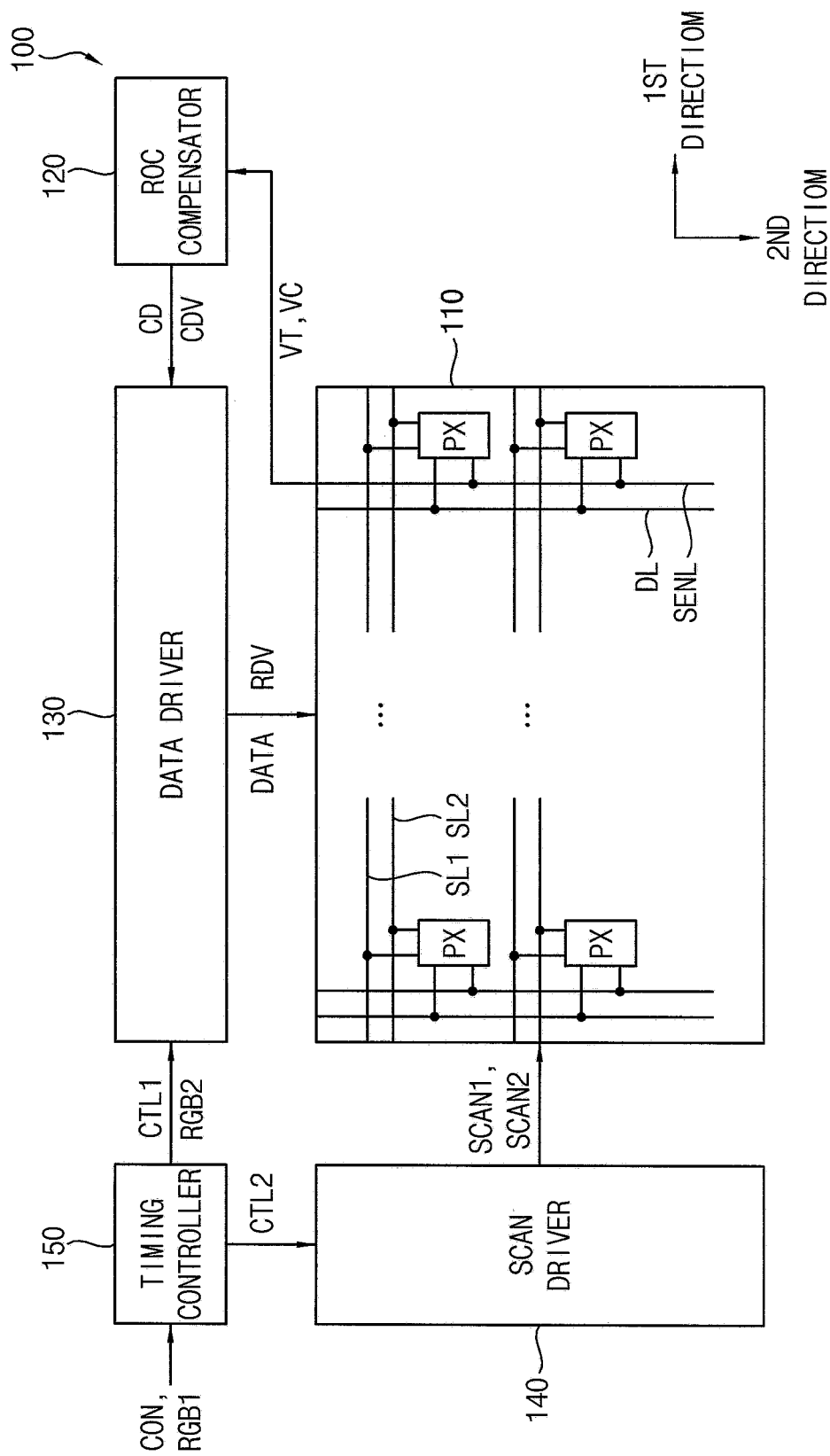
FIG. 1 is a block diagram of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to exemplary embodiments of the invention will be explained in detail with reference to the accompanying drawings.

Figure 2:
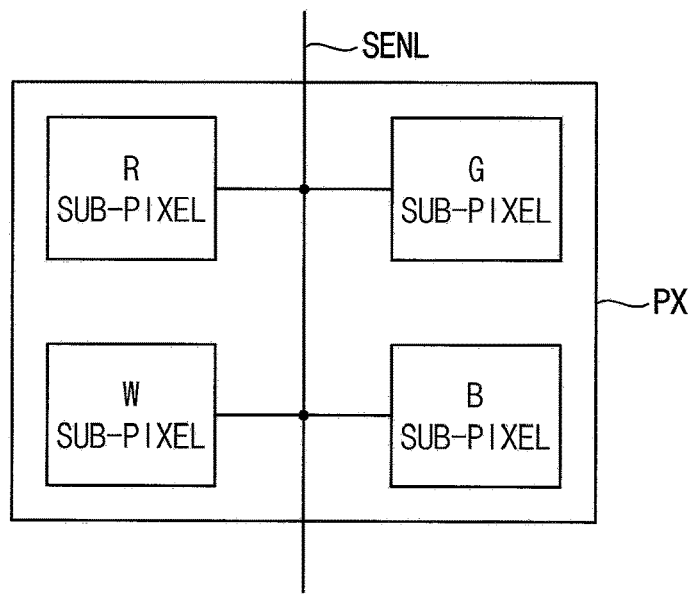
FIG. 2 is a block diagram of one representative pixel in the display device of FIG.
Figure 3:
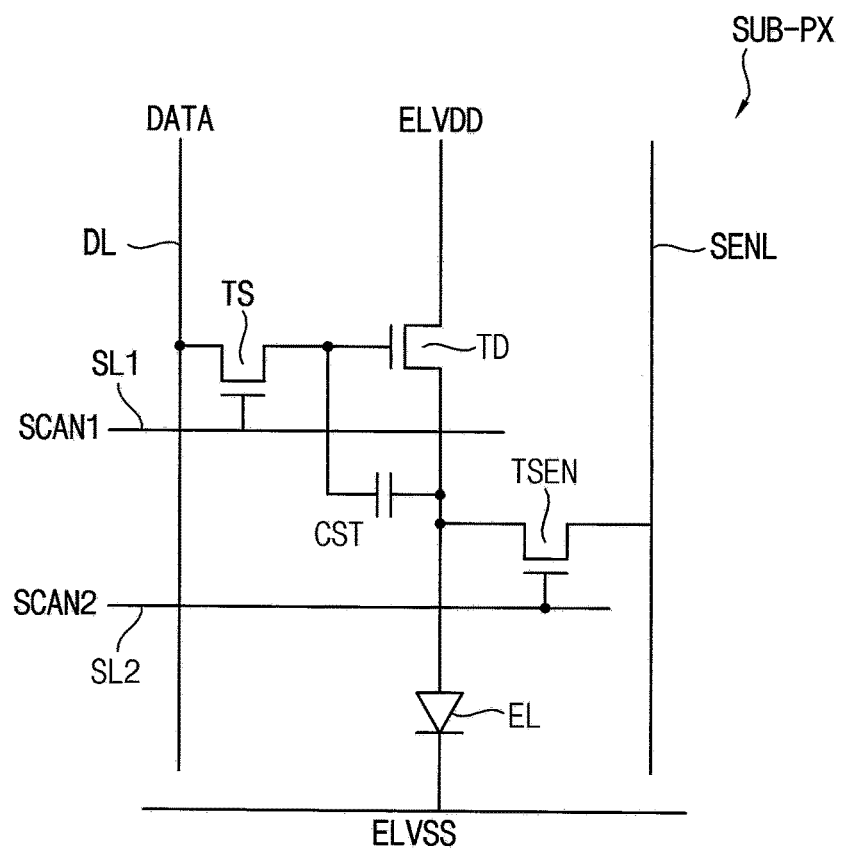
FIG. 3 is an equivalent circuit diagram of a sub-pixel of the pixel of FIG. 2.

FIG. 1 is a block diagram of an exemplary embodiment of a display device constructed according to principles of the invention. FIG. 2 is a block diagram of one representative pixel in the display device of FIG. 1. FIG. 3 is an equivalent circuit diagram of a sub-pixel of the pixel of FIG. 2.

Referring to FIG. 1, a display device 100 may include a display panel 110, a charging ratio compensator 120, a data driver 130, a scan driver 140, and a timing controller 150.

A plurality of first scan lines SL1 and second scan lines SL2, a plurality of data lines DL, and a plurality of sensing lines SENL may be formed in the display panel 110. The first and second scan lines SL1, SL2 may extend in a first direction 1ST DIRECTION and be arranged in a second direction 2ND DIRECTION substantially perpendicular to the first direction 1ST DIRECTION. The data lines DL may extend in the second direction 2ND DIRECTION and be arranged in the first direction 1ST DIRECTION. The sensing lines SENL may be formed substantially in parallel with the data lines DL. That is, the sensing lines SENL may extend in the second direction 2ND DIRECTION and be arranged in the first direction 1ST DIRECTION. The first direction 1ST DIRECTION may be substantially parallel with a long side of the display panel 110, and the second direction 2ND DIRECTION may be substantially parallel with a short side of the display panel 110. Each of the pixels PX may be formed in intersection regions of the data lines DL and the scan lines SL1, SL2.

Referring to FIG. 2, one pixel PX may include a plurality of sub-pixels. For example, one pixel PX may include a red sub-pixel that displays a red color, a green sub-pixel that displays a green color, a blue sub-pixel that displays a blue color, and a white sub-pixel that displays a white color. The sub-pixels included in the pixel PX may be coupled to the same sensing line SENL. The charging ratio compensator 120 may sequentially sense a voltage charged in the sub-pixels through the sensing line SENL.

Referring to FIG. 3, each of the sub-pixels sub-PX may include a switching transistor TS, a storage capacitor CST, a driving transistor TD, a sensing transistor TSEN, and an organic light emitting diode EL. The sub-pixel sub-PX of FIG. 3 may correspond to one of the red sub-pixel, the green sub-pixel, the blue sub-pixel, and the white sub-pixel of FIG. 2. When the display device 100 is operated, the switching transistor TS may transfer a data voltage DATA based on a scan signal SCAN1. The switching transistor TS may include a first electrode, a gate electrode, and a second electrode. The first electrode of the switching transistor TS may be coupled to the data line DL through which the data voltage DATA is provided. The gate electrode of the switching transistor TS may be coupled to the first scan line SL1 through which the first scan signal SCAN1 is provided. The second electrode of the switching transistor TS may be coupled to a gate electrode of the driving transistor TD. The data voltage DATA provided through the data line DL may be provided to the storage capacitor CST when the switching transistor TS turns on. The storage capacitor CST may store the data voltage DATA. The storage capacitor CST may include a first electrode and a second electrode. The first electrode of the storage capacitor CST may be coupled to the gate electrode of the driving transistor TD. The second electrode of the storage capacitor CST may be coupled to an anode electrode of the organic light emitting diode EL. When the display device is operated, the driving transistor may generate a driving current based on the data voltage DATA. The driving transistor TD may include a first electrode, a gate electrode, and a second electrode. The first electrode of the driving transistor TD may be coupled to a first power supply line that provides a high power voltage ELVDD. The gate electrode of the driving transistor TD may be coupled to the storage capacitor CST. The second electrode of the driving transistor TD may be coupled to the anode electrode of the organic light emitting diode EL. When the display device 100 is operated, the organic light emitting diode EL may emit light based on the driving current. The organic light emitting diode EL may include the anode electrode and a cathode electrode. The anode electrode of the organic light emitting diode EL may be coupled to the second electrode of the driving transistor TD. The cathode electrode of the organic light emitting diode may be coupled to a second power supply line that provides a low power voltage ELVSS. The sensing transistor TSEN may be coupled between the storage capacitor CST and the sensing line SENL. The sensing transistor TSEN may turn on or turn off in response to the second scan signal SCAN2. The sensing transistor may include a first electrode, a gate electrode, and a second electrode. The first electrode of the sensing transistor TSEN may be coupled to the anode electrode of the organic light emitting diode E1. The gate electrode of the sensing transistor TSEN may be coupled to the second scan line SL2 that provides the second scan signal SCAN2. The second electrode of the sensing transistor TSEN may be coupled to the sensing line SENL. When the charging ratio compensator 120 senses the voltage charged in the sub-pixel, the sensing transistor TSEN may turn on and the voltage stored in the storage capacitor CST may be sensed through the sensing line SENL.

Although the sub-pixel sub-PX that includes the switching transistor TS, the storage capacitor CST, the driving transistor TD, the sensing transistor TSEN, and the organic light emitting diode EL is described in FIG. 3, the sub-pixel sub-PX may not be limited thereto. For example, the sub-pixel may further include an initialization transistor that initializes the gate electrode of the driving transistor TD and the anode electrode of the organic light emitting diode EL, and an emission transistor that controls an emission of the organic light emitting diode EL. Further, although the switching transistor TS, the driving transistor TD, and the sensing transistor TSEN implemented as a n-channel metal oxide semiconductor (NMOS) transistors are described in FIG. 3, the switching transistor TS, the driving transistor TD, and the sensing transistor TSEN may not be limited thereto. For example, the switching transistor TS, the driving transistor TD, and the sensing transistor TSEN may be implemented as a p-channel metal oxide semiconductor (PMOS) transistors. In this case, the switching transistor TS, the driving transistor TD, and the sensing transistor TSEN may turn on in response to a signal having a low level and turn off in response to a signal having a high level.

The charging ratio compensator 120 may sense a target voltage VT charged in the pixel PX to which a reference data voltage RDV is provided during a target time, sense a charging voltage charged in the pixel PX to which the reference data voltage RDV is provided during a charging time, and when the difference of the target voltage VT and the charging voltage VC is greater than the reference value, output a compensating data that changes the voltage level of the reference data voltage RDV provided to the pixel PX during the charging time until the difference of the target voltage VT and the charging voltage VC is equal to or less than a predetermined reference value. In some example embodiments, the charging ratio compensator 120 may be operated when the display device 100 is not driven. In case that correction voltages for compensating a charging ratio of the pixel PX is generated when the display device 100 is driven, an abnormal image may be displayed due to the reference data voltage RDV provided to the pixel PX. Thus, the charging ratio compensator 120 may be operated when a power the display device 100 turns off.

The data driver 130 may provide the reference data voltage RDV to the data lines DL while the charging ratio compensator 120 is operated (i.e., the power of the display device turns off). The data driver 130 may provide the reference data voltage RDV to the pixel PX during the target time. Here, the target time is a time to allow the charging ratio of the pixel PX to be saturated. The target time may be determined by a property of the display device 100. For example, the target time may be determined by a capacity of the storage capacitor CST in the pixel PX. In some example embodiments, the target time may be controlled by changing a driving frequency of the display device 100. For example, in case of the display device 100 driven at a frequency of 120 Hz, the target time during which the reference data voltage RDV is provided to the pixel PX may be controlled by changing the driving frequency to 30 Hz. The reference data voltage RDV may have a voltage level corresponding one of grayscales displayed on the display device 100. For example, when the display device 100 is driven in 8-bit, the reference data voltage RDV may have the voltage level corresponding to one of 256 grayscales. The reference data voltage RDV may be provided to the pixel PX as the data voltage DATA through the data line DL during the target time. Further, the data driver 130 may provide the reference data voltage RDV to the pixel PX during the charging time.

Here, the charging time may be the same as a data writing time of a horizontal period. The charging time may be changed based on the driving frequency of the display device 100. For example, the charging time may decrease as the driving frequency of the display device 100 increases. The reference data voltage RDV may be provided to the pixel PX as the data voltage DATA through the data line DL during the charging time. Further, the data driver 130 may change the voltage level of the reference data voltage RDV based on the compensating data CD provided from the charging ratio compensator 120 and provide the reference data voltage RDV of which the voltage level is changed to the data line DL during the charging time.

The data driver 130 may generate data voltage DATA based on a second image data RGB2 provided from the timing controller 150 and the correction data voltage CDV provided from the charging ratio compensator 120 when the display device 100 is driven and provide the data voltage DATA to the data line DL based on a data control signal CTL1 provided from the timing controller 150.

The charging ratio compensator 120 may sense the voltage charged in the pixel PX during the target time as the target voltage VT. That is, the target voltage VT is the voltage charged in the pixel PX when the reference data voltage RDV is provided to the pixel PX has enough time. Further, the charging ratio compensator 120 may sense the voltage charged in the pixel PX during the charging time as the charging voltage VC. That is, the charging voltage VC may be the voltage substantially charged in the pixel PX when the display device 100 is driven. When the display device 100 is driven in a high frequency, the charging voltage VC may decrease as the charging time decreases. The charging ratio compensator 120 may change the voltage level of the reference data voltage RDV provided during the charging time when the difference of the target voltage VT and the charging voltage VC is greater than the reference value. For example, when the charging voltage VC is less than the target voltage VT and the difference of the target voltage VT and the charging voltage VC is greater than the reference value, the charging ratio compensator 120 may output the compensating data CD that increases the voltage level of the reference data voltage RDV to the data driver 130. The data driver 130 may increase the voltage level of the reference data voltage RDV based on the compensating data CD and provide the reference data voltage RDV of which the voltage level is increased to the data line DL. The charging ratio compensator 120 may decrease the difference of the target voltage VT and the charging voltage VC by providing the reference data voltage RDV of which the voltage level is increased to the pixel PX during the charging time and sensing the charging voltage VC. The charging ratio compensator 120 may repeatedly perform the step of comparing the difference of the target voltage VT and the charging voltage VC to the reference value and output the compensating data CD that changes the voltage level of the reference data voltage RDV. When the difference of the target voltage VT and the charging voltage VC is equal to or less than the reference value, the charging ratio compensator 120 may store the reference data voltage as a correction data voltage and may not output the compensating data CD any more. In some example embodiments, the charging ratio compensator 120 may determine the voltage corresponding to each of the grayscales as the reference data voltage RDV and generate the correction data voltage corresponding to each of the grayscales. For example, when the display device 100 is driven in 8-bit, the charging ratio compensator 120 may determine the correction data voltage corresponding to the reference data voltage RDV using the reference data voltage RDV corresponding to 0 through 255 grayscale and store the correction data voltage. In other example embodiments, the charging ratio compensator 120 may determine the voltages corresponding to predetermined grayscales as the reference data voltages RDV, generate the correction data voltages corresponding to the reference data voltages RDV, and generate the correction data voltages between the predetermined grayscales by interpolating the correction data voltages corresponding to the reference data voltages RDV. For example, the charging ratio compensator 120 may determine the correction data voltage using the reference data voltages RDV corresponding to 0 grayscale, 8 grayscale, 16 grayscale, 32 grayscale, 64 grayscale, 128 grayscale, and 255 grayscale, and generate the grayscales (i.e., 1~7 grayscale, 9~15 grayscale, 17~31 grayscale, 33~36 grayscale, 65~127 grayscale, and 129~254 grayscale) between above grayscales by interpolating the correction data voltages. The charging ratio compensator 120 may provide the correction data voltage to the data driver 130 and the data driver 130 may generate the data voltage DATA based on the correction data voltage when the display device 100 is driven.

Although the charging ratio compensator 120 coupled to the data driver 130 is described in FIG. 1, the charging ratio compensator 120 is not limited thereto. For example, the charging ratio compensator 120 may be disposed in the data driver 130. Alternatively, the charging ratio compensator 120 may be coupled to the timing controller 150, or disposed in the timing controller 150.

The scan driver 140 may provide the first scan voltage SCAN1 and the second scan voltage SCAN2 through the scan lines SL1, SL2 when the charging ratio compensator 120 is operated. For example, the reference data voltage RDV may be provided to the pixels while the first scan voltage SCAN1 is provided and target voltage VT or the charging voltage VC charged in the pixels PX may be sensed while the second scan voltage SCAN2 is provided. The scan driver 140 may output the first scan voltage SCAN1 and the second scan voltage SCAN2 based on the scan control signal CTL2 provided from the timing controller 150.

The timing controller 150 may generate control signals that control the data driver 130 and the scan driver 140 when the display device 100 is driven. The timing controller 150 may generate the data control signal CTL1 that control a timing of the data driver 130 and the scan control signal CTL2 that control a timing of the scan driver 140 based on a control signal CON provided from an external device. Further, the timing controller 150 may convert the first image data RGB1 provided from the external device to the second image data RGB2 by adjusting an algorithm for compensating display quality.

As described above, the display device 100 according to example embodiments may sense the target voltage VT charged in the pixel PX during the target time and the charging voltage VC charged in the pixel PX during the charging time and store the correction data voltage CDV that decrease the difference of the target voltage VT and the charging voltage VC as change the voltage level of the reference data voltage RDV provided during the charging time. Thus, decreasing of the charging ratio of the pixel may be prevented although the display device 100 is driven in a high frequency mode or has a high resolution.

Figure 4:
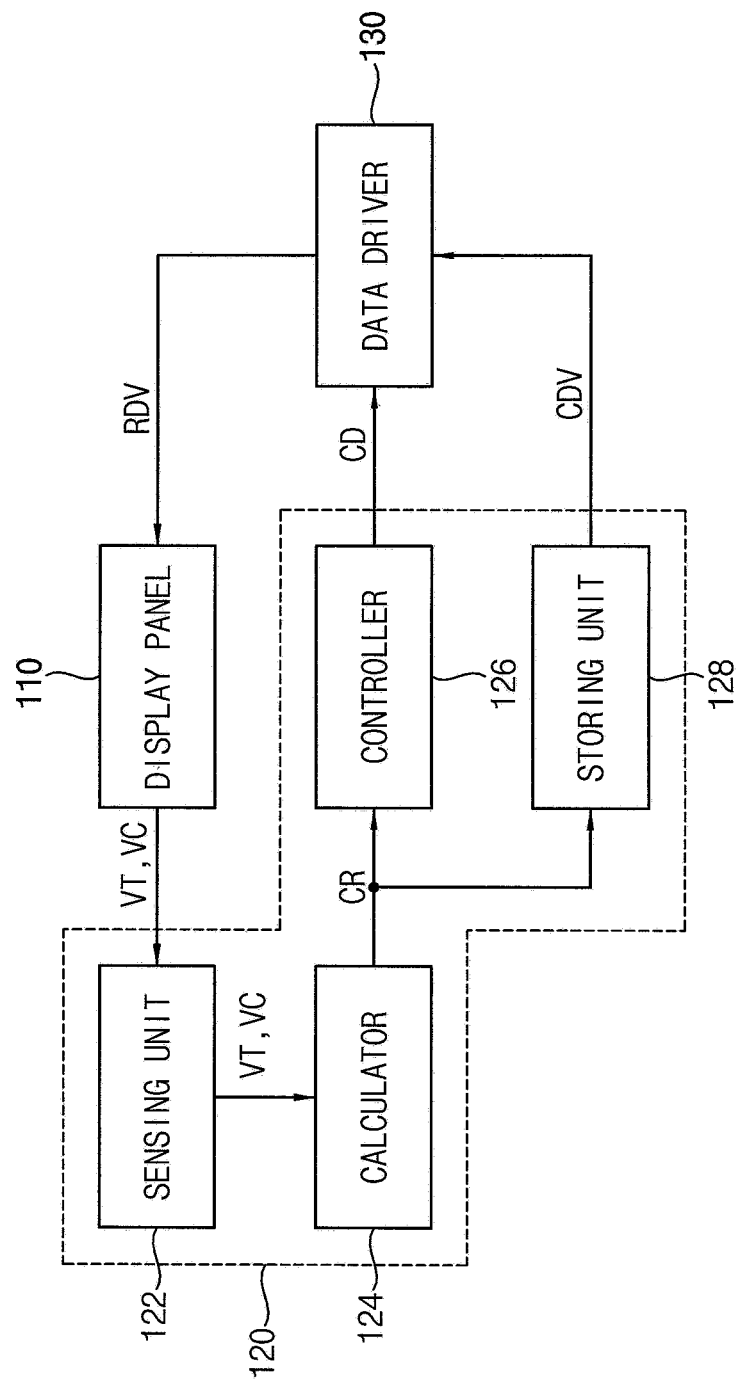
FIG. 4 is a block diagram of an exemplary embodiment of a charging ratio compensator in the display device of FIG. 1.

FIG. 4 is a block diagram of an exemplary embodiment of a charging ratio compensator in the display device of FIG.

Figure 5A:
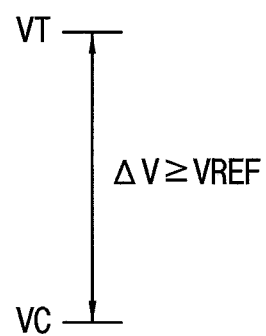
FIGS. 5A and 5B are diagrams illustrating an operation of a controller and a storage unit in the charging ratio compensator of FIG. 4.
Figure 5B:
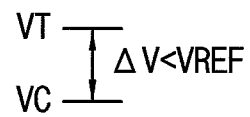

1. FIGS. 5A and 5B are diagrams illustrating an operation of a controller and a storage unit in the charging ratio compensator of FIG. 4.

In exemplary embodiments, the charging ratio compensator 120 may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

Referring to FIG. 4, the charging ratio compensator 120 may include a sensor 122, a calculator 124, a controller 126, and a storage unit 128. According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the charging ratio compensator 120 may include or otherwise be associated with one or more memories (e.g., storing unit 128) including code (e.g., instructions) configured to cause the one or more components (e.g., sensor 122, calculator 124, and controller 126) in the charging ratio compensator 120 to perform one or more of the features, functions, processes, etc., described herein.

The sensor 122 may sense the target voltage VT and the charging voltage VC through the sensing line SENL. The sensor 122 may be coupled to the sensing line SENL formed in the display panel 110 and sense the voltage charted in the pixel PX. Specifically, the sensor 122 may sense the target voltage VT through the sensing line SENL coupled to the pixel to which the reference data voltage RDV is provided during the target time, and sense the charging voltage VC through the sensing line SENL coupled to the pixel to which the reference data voltage RDV is provided during the charging time. The sensor 122 may output the target voltage VT and the charging voltage VC to the calculator 124.

The calculator 124 may compare the difference of the target voltage VT and the charging voltage VC to the predetermined reference value. The calculator 124 may calculate the difference of the target voltage VT and the charging voltage VC. The calculator 124 may compare the difference of the target voltage VT and the charging voltage VC to the reference value and output a comparing result CR.

The controller 126 may output the compensating data CD to the data driver 130 based on the comparing result CR of the difference of the target voltage VT and the charging voltage VC to the reference value. Referring to FIG. 5A, when the difference ΔV of the target voltage VT and the charging voltage VC is greater than the reference value VREF, the controller 126 may output the compensating data CD that changes the voltage level of the reference data voltage RDV. Here, in case that the voltage level of the target voltage VT is greater than the voltage level of the charging voltage VC, the controller 126 may output the compensating data CD that increases the voltage level of the reference data voltage RDV. In case that the voltage level of the target voltage VT is less than the voltage level of the charging voltage VC, the controller 126 may output the compensating data CD that decreases the voltage level of the reference data voltage RDV.

The storage unit 128 may store the reference data voltage RDV as the correction data voltage CDV based on the comparing result CR of the difference of the target voltage VT and the charging voltage VC and the to the reference value. As described in FIG. 5B, when the difference ΔV of the target voltage VT and the charging voltage VC is equal to or less than the reference value VREF, the storage unit 128 may store the reference data voltage RDV as the correction data voltage CDV. The storage unit 128 may store the correction data voltages CDV corresponding to each of the grayscales in the lookup table (LUT). The storage unit 128 may be coupled to the data driver 130 and provide the correction data voltage CDV to the data driver 130 when the display device 100 is driven.

As described above, the charging ratio compensator 120 of the display device 100 may sense the target voltage VT charged in the pixel during the target time and the charging voltage charged in the pixel during the charging time, change the voltage level of the reference data voltage RDV when difference ΔV of the target voltage VT and the charging voltage VC is greater than the reference value VREF, and store the reference data voltage RDV as the correction data voltage CDV when difference ΔV of the target voltage VT and the charging voltage VC is equal to or less than the reference value VREF. Thus, the charging ratio compensator 120 may prevent the decreasing of the charging ratio of the pixel by providing the correction data voltage CDV to the pixel when the display device 100 is driven.

Figure 6:
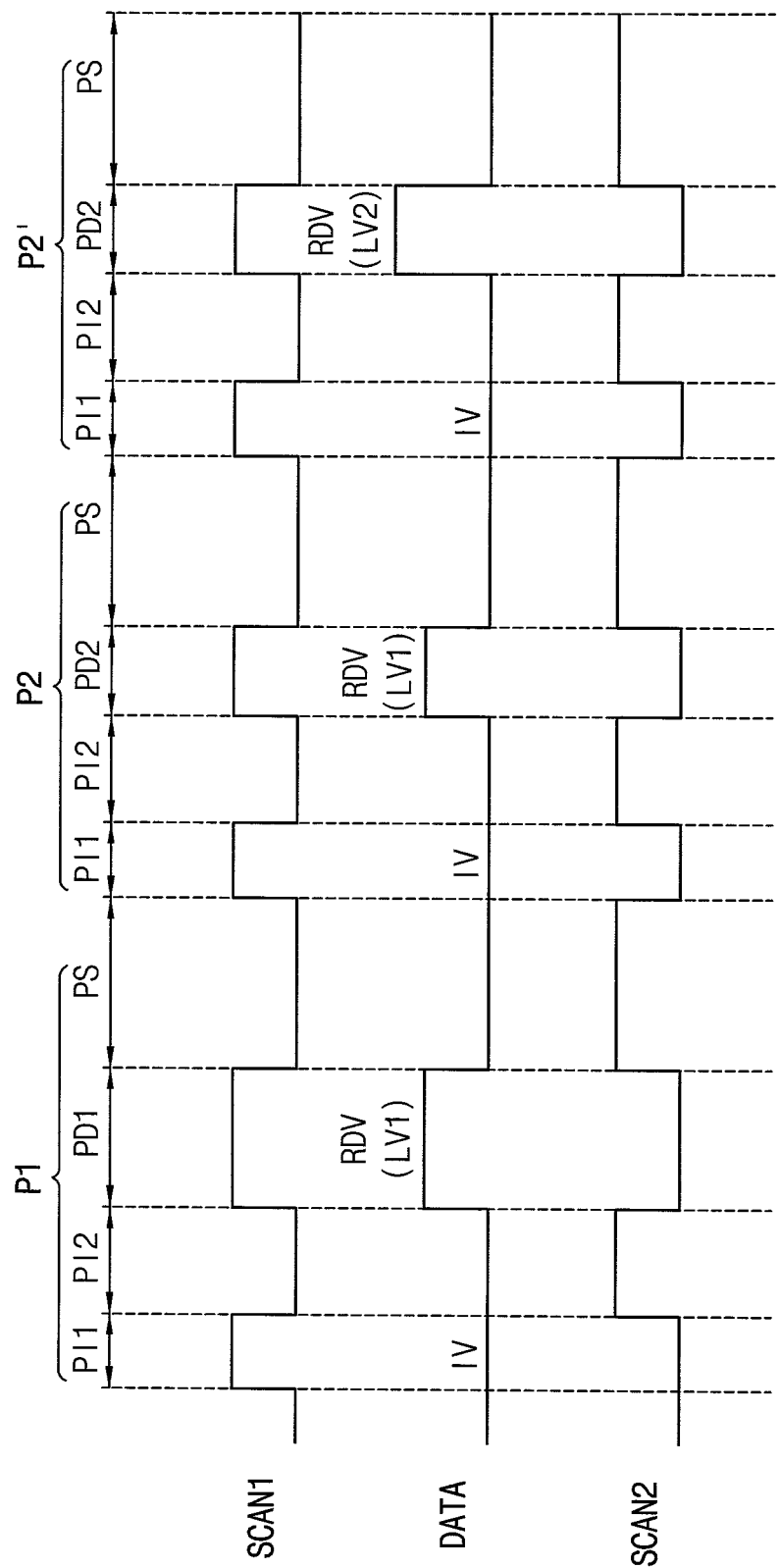
FIG. 6 is a timing diagram illustrating an exemplary embodiment of an operation of the display device of FIG. 1.

FIG. 6 is a timing diagram illustrating an exemplary embodiment of an operation of the display device of FIG. 1. FIGS. 7A through 7D are equivalent circuit diagrams illustrating an operation of the pixel by the timing diagram of FIG. 6.

Referring to FIG. 6, each of the pixels may be operated in a first period P1 and a second period P2, and a third compensating period P2'.

Figure 7A:
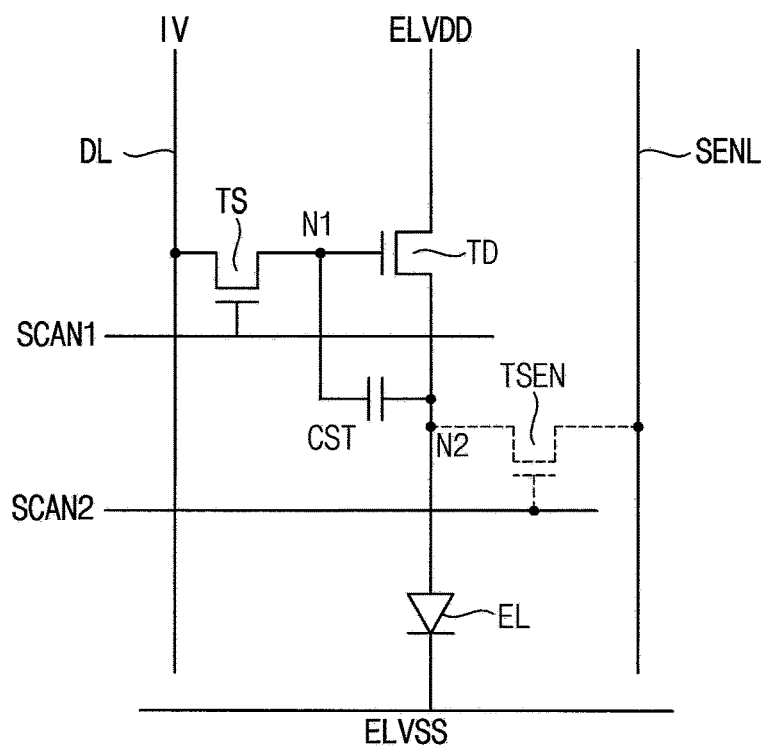
FIGS. 7A, 7B, 7C, and 7D are equivalent circuit diagrams illustrating an operation of the pixel by the timing diagram of FIG. 6.
Figure 7B:
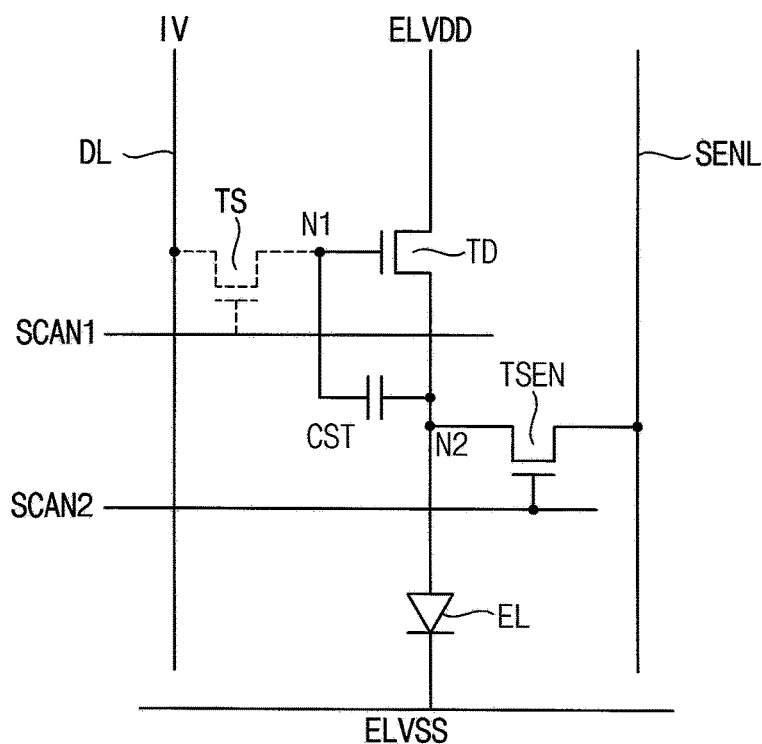
Figure 7C:
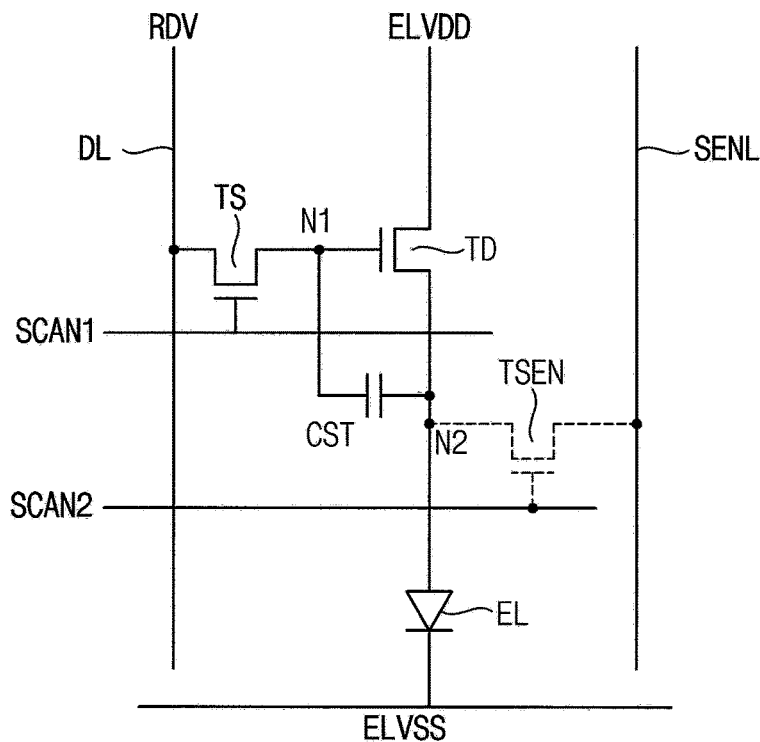
Figure 7D:
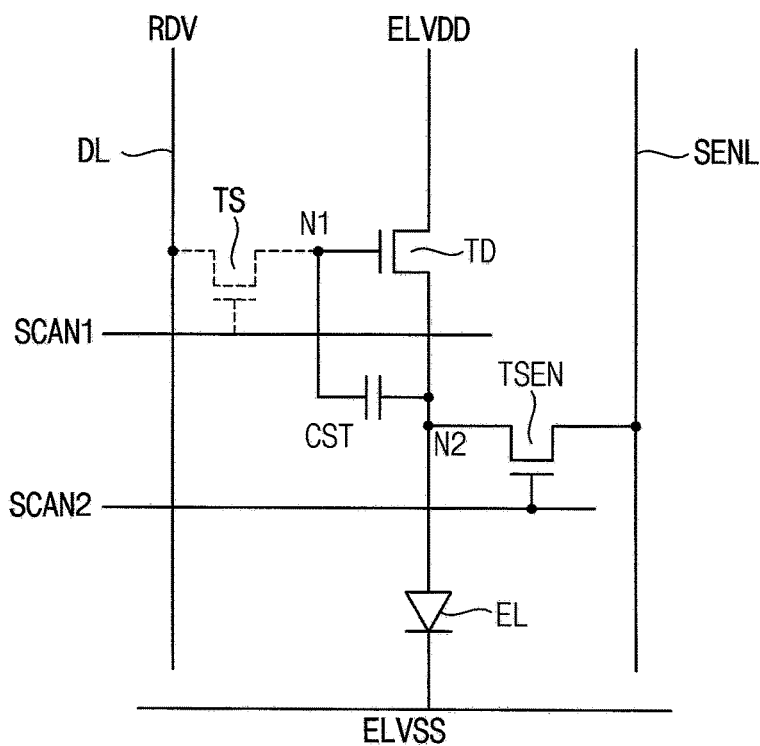

Referring to FIG. 6, the first period P1 may include a first initialization period PI1, a second initialization period PI2, a first data writing period PD1, and a sensing period PS. The first scan voltage SCAN1 having a high level and the second scan voltage SCAN2 having a low level may be provided to the pixel from the scan controller during the first initialization period PI1 of the first period P1. Referring to FIG. 7A, the switching transistor TS may turn on in response to the first scan voltage SCAN1 having the high level, and the sensing transistor may turn off in response to the second scan voltage SCAN2 having the low level. Here, an initialization voltage IV (e.g., 0V) for initializing a voltage of the first node N1 may be provided as the data voltage DATA through the data line DL. The initialization voltage IV may be provided through the switching transistor TS, and the data line DL and the first node N1 may be initialized. The first scan voltage SCAN1 having the low level and the second scan voltage having the high level may be provided to the pixel form the scan controller during the second initialization period PI2 of the first period P1. Referring to FIG. 7B, the switching transistor TS may turn off in response to the first scan voltage SCAN1 having the low level, and the sensing transistor TS may turn on in response to the second scan voltage SCAN2 having the high level. Here, a low power voltage ELVSS may be provided to the sensing line SENL through the sensing transistor TS and the sensing line SENL may be initialized. The first scan voltage SCAN1 having the high level and the second scan voltage SCAN2 having the low level may be provided to the pixel during the first data writing period PD1 of the first period P1. Here, the length of the first data writing period PD1 is substantially the same as a length of the target time. Referring to FIG. 7C, the switching transistor TS may turn on in response to the first scan voltage SCAN1 having the high level and the sensing transistor TS may turn off in response to the second scan signal SCAN2 having the low level. Here, the reference data voltage RDV having a first voltage level LV1 may be provided as the data voltage DATA through the data line DL. That is, the sensing transistor TS may turn on and the reference data voltage RDV provided through the data line DL may be provided to the first node N1 during the first data writing period PD1 of the first period P1. Thus, the reference data voltage RDV may be charged in the storage capacitor CST during an enough time (i.e., the target time). The first scan voltage SCAN1 having the low level and the second scan voltage SCAN2 having the high level may be provided to the pixel during the sensing period PS of the first period P1. Referring to FIG. 7D, the switching transistor TS may turn off in response to the first scan voltage SCAN1 having the low level and the sensing transistor TS may turn on in response to the second scan voltage SCAN2 having the high level. The charging ratio compensator may sense a voltage of a second node N2 as the target voltage through the sensing line SENL. That is, the first period P1 may correspond to the period of sensing a target voltage VT charged in the pixel PX to which a reference data voltage RDV is provided during a target time.

Referring to FIG. 6, the second period P2 may include a first initialization period PI1, a second initialization period PI2, a second data writing period PD2, and a sensing period PS substantially the same as the first period P1. The first scan voltage SCAN1 having the high level and the second scan voltage SCAN2 having the low level may be provided to the pixel from the scan controller during the first initialization period PI1 of the second period P2. Referring to FIG. 7A, the switching transistor TS may turn on in response to the first scan voltage SCAN1 having the high level, and the sensing transistor may turn off in response to the second scan voltage SCAN2 having the low level. Here, the initialization voltage IV (e.g., 0V) for initializing a voltage of the first node N1 may be provided as the data voltage DATA through the data line DL. The initialization voltage IV may be provided through the switching transistor TS, and the data line DL and the first node N1 may be initialized. The first scan voltage SCAN1 having the low level and the second scan voltage having the high level may be provided to the pixel form the scan controller during the second initialization period PI2 of the second period P2. Referring to FIG. 7B, the switching transistor TS may turn off in response to the first scan voltage SCAN1 having the low level, and the sensing transistor TS may turn on in response to the second scan voltage SCAN2 having the high level. Here, a low power voltage ELVSS may be provided to the sensing line SENL through the sensing transistor TS and the sensing line SENL may be initialized. The first scan voltage SCAN1 having the high level and the second scan voltage SCAN2 having the low level may be provided to the pixel during the second data writing period PD2 of the second period P2. Here, a length of the second data writing period PD2 is the same as a length of the charging time. Referring to FIG. 7C, the switching transistor TS may turn on in response to the first scan voltage SCAN1 having the high level and the sensing transistor TS may turn off in response to the second scan signal SCAN2 having the low level. Here, the reference data voltage RDV having the first voltage level LV1 may be provided as the data voltage DATA through the data line DL. That is, the sensing transistor TS may turn on and the reference data voltage RDV provided through the data line DL may be provided to the first node N1 during the second data writing period PD2 of the second period P2. Thus, the reference data voltage RDV may be charged in the storage capacitor CST during a time in which the data voltage is substantially provided when the pixel is operated (i.e., the charging time). The first scan voltage SCAN1 having the low level and the second scan voltage SCAN2 having the high level may be provided to the pixel during the sensing period PS of the second period P2. Referring to FIG. 7D, the switching transistor TS may turn off in response to the first scan voltage SCAN1 having the low level and the sensing transistor TS may turn on in response to the second scan voltage SCAN2 having the high level. The charging ratio compensator may sense a voltage of a second node N2 as the sensing voltage through the sensing line SENL. That is, the second period P2 may correspond to the period of sensing a charging voltage charged in the pixel PX to which the reference data voltage RDV is provided during a charging time.

The display device may be driven in different frequencies in each of the first period P1 and the second period P2. For example, the display device may control the target time (i.e., the first data writing period PD1) during which the reference data voltage RDV is provided to the pixel by driving in the low frequency (e.g., 30 Hz) during the first period P1. Further, the display device may control the charging time (i.e., the second data writing period PD2) during which the reference data voltage RDV is substantially provided to the pixel by driving in the high frequency (e.g., 120 Hz) during the second period.

The charging ratio compensator 120 may compare the target voltage sensed in the first period P1 and the charging voltage sensed in the second period P2, change the voltage level of the reference data voltage RDV (e.g., from LV1 to LV2 as shown in FIG. 6), and repeatedly perform the operation of the second period P2 when the difference of the target voltage and the charging voltage is greater than the reference value. Referring to FIG. 6, in the third period P2', when the difference of the target voltage and the charging voltage is greater than the reference value, the charging ratio compensator may initialize the data line DL and the first node N1 during the first initialization period PI1, initialize the sensing line SENL during the second initialization period PI2, write the reference data voltage RDV to the pixel during the second data writing period PD2, and perform the operation of the second period P2 during which the voltage charged in the pixel is sensed again. Here, the reference data voltage RDV provided to the pixel may have a second voltage level LV2. The charging ratio compensator may change the voltage level of the reference data voltage and sense the charging voltage by performing the operation of the second period P2, and the third period P2' until the difference of the target voltage and the charging voltage is equal to or less than the reference value. The charging ratio compensator may store the reference data voltage RDV provided in the second period as the correction data voltage when the difference of the target voltage and the charging voltage is equal to or less than the reference value.

As described above, each of the pixels may be operated in the first period P1, the second period P2, and the third period P2' when a power of the display device turns off. The reference data voltage RDV may be written in the pixel during the target time and the target voltage may be sensed in the first period P1. The reference data voltage RDV may be written in the pixel during the charging time and the charging voltage may be sensed in the second period P2. The correction data voltage that compensates the charging ratio of the pixel may be calculated by repeatedly performing the operation of the second period P2 and the third period P2' when the difference of the target voltage and the charging voltage is greater than the reference value.

Figure 8:
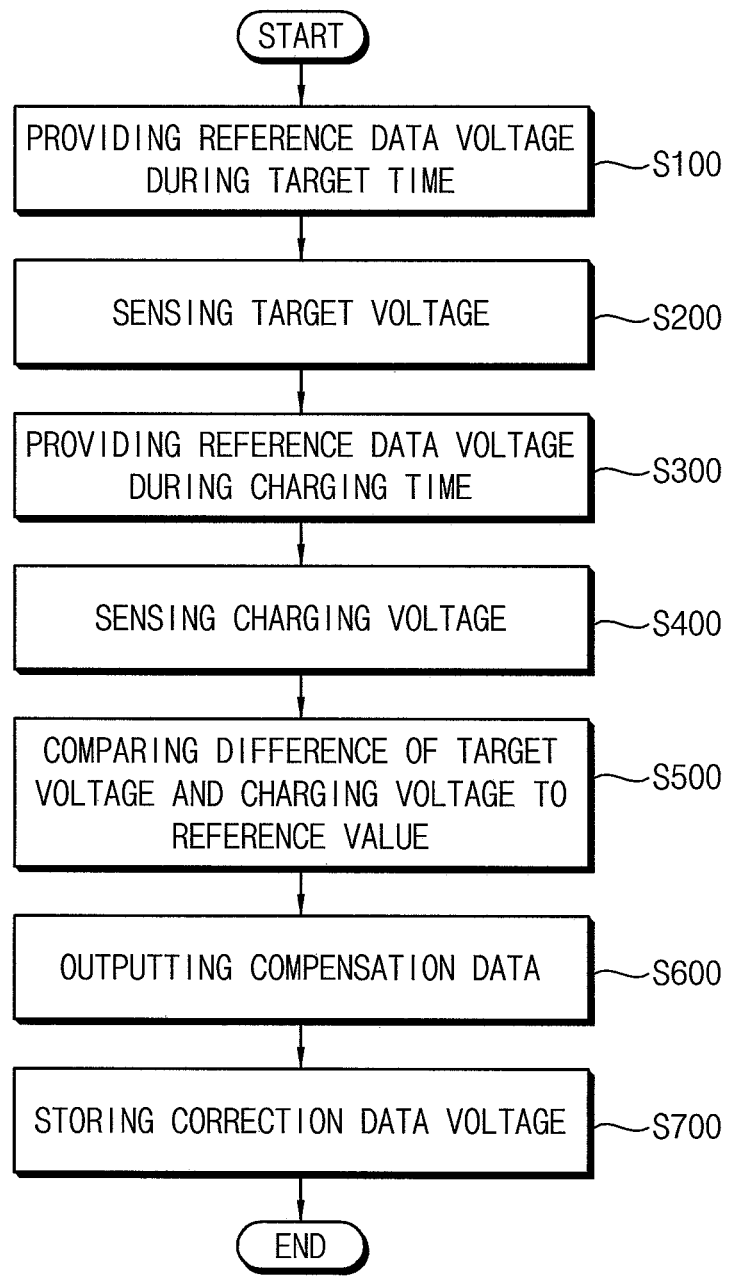
FIG. 8 is a flowchart of an exemplary embodiment of a method for improving image quality of a display device implemented according to principles of the invention.

FIG. 8 is a flowchart of an exemplary embodiment of a method for improving image quality of a display device implemented according to principles of the invention.

Referring to FIG. 8, a method for improving image quality of a display device may include the steps of providing a predetermined reference data voltage to the pixels included in the display panel during a predetermined target time S100, sensing a target voltage charged in the pixels S200, providing the reference data voltage to the pixels during the charging time S300, sensing a charging voltage charged in the pixel S400, comparing a difference of the target voltage and the charging voltage to a predetermined reference value S500, outputting a compensating data that changes a voltage level of the reference data voltage provided during the charging time when the difference of the target voltage and the charging voltage is greater than the reference value S600, and storing the reference data voltage as a correction data voltage when the difference of the target voltage and the charging voltage is equal to or less than the reference value S700.

The method for improving the image quality of the display device may further include the step of initializing the pixels. The method for improving the image quality of the display device may provide an initialization voltage (e.g., 0V) to the pixels through a data line. Here, a switching transistor and a sensing transistor included in the pixel may sequentially turn on, and the data line DL, the gate electrode of the driving transistor and the sensing line may be initialized.

The method for improving the image quality of the display device may provide the predetermined data voltage to the pixel during the predetermined target time S100. The method for improving the image quality of the display device may provide the reference data voltage to the pixel initialized during the target time. Here, the target time is a time to allow the charging ratio of the pixel to be saturated. The reference data voltage may be the voltage corresponding to each of the grayscales. The method for improving the image quality of the display device may sequentially change the reference data voltage corresponding to each of the grayscales and generate the correction data voltage corresponding to the each of the grayscales. The charging ratio of the pixel may be maximized when the reference data voltage is provided to the pixel during the target time.

The method for improving the image quality of the display device may sense the target voltage charged in the pixels S200. The method for improving the image quality of the display device may sense the voltage charged in the pixel during the target time as the target voltage. That is, the target voltage is the voltage charged in the pixel when the charging ratio of the pixel is maximized.

The method for improving the image quality of the display device may further include the operation of initializing the pixels. The method for improving the image quality of the display device may provide the initialization voltage to the pixels through the data line to initialize the voltage charged during the target time. Here, the switching transistor and the sensing transistor included in the pixel may sequentially turn on, and the gate electrode of the driving transistor and the sensing line may be initialized.

The method for improving the image quality of the display device may provide the reference data voltage during the predetermined charging time S300. The method for improving the image quality of the display device may provide the reference data voltage to the initialized pixel during the charging time. Here, the charging time may be the same as a data writing time of a horizontal period and be shorter than the target time. The method for improving the image quality of the display device may provide the reference data voltage having the same voltage level of the reference data voltage provided during the target time to the pixel during the charging time.

The method for improving the image quality of the display device may sense the charging voltage charged in the pixels S400. The method for improving the image quality of the display device may sense the voltage charged in the pixel during the charging time as the charging voltage. That is, the charging voltage may be the voltage substantially charged in the pixel when the display device is driven.

The method for improving the image quality of the display device may compare the difference of the target voltage and the charging voltage to the predetermined reference value S500. The method for improving the image quality of the display device may compare the difference of the target voltage and the charging voltage to the reference value and output a comparing result.

The method for improving the image quality of the display device may output the compensating data that changes the voltage level of the reference data voltage provided during the charging time when the difference of the target voltage and the charging voltage is greater than the reference value S600. The method for improving the image quality of the display device may output the compensating data that increase the voltage level of the reference data voltage to the data driver when the difference of the target voltage and the charging voltage is greater than the reference value and the voltage level of the target voltage is greater than the voltage level of the charging voltage. Further, the method for improving the image quality of the display device may output the compensating data that decrease the voltage level of the reference data voltage tot eh data driver when the difference of the target voltage and the charging voltage is equal to or less than the reference value and the voltage of the target voltage is less than the voltage level of the charging voltage. The method for improving the image quality of the display device may sense the charging voltage as changes the voltage level of the reference data voltage and compare the difference of the target voltage and the charging voltage and the reference value until the difference of the target voltage and the charging voltage is equal to or less than the reference value.

The method for improving the image quality of the display device may store the reference data voltage as the correction data voltage when the difference of the target voltage and the charging voltage is equal to or less than the reference value S700. In some example embodiments, the method for improving the image quality of the display device may generate the correction data voltage corresponding to the reference data voltage corresponding to each to the grayscale and generate the correction data voltage corresponding to all grayscales. In other example embodiments, the method for improving the image quality of the display device may generate the correction data voltage corresponding to the reference data voltage corresponding to a predetermined grayscale and generate the correction data voltage corresponding to all grayscales by interpolating the correction data voltage.

As described above, the method for improving the image quality of the display device may generate the correction data voltage for compensating the charging ratio of the pixel by sensing the target voltage of the pixel to which the reference data voltage is provided during the target time, sensing the charging voltage of the pixel to which the reference data voltage is provide during the charging time, and changing the voltage level of the reference data voltage until the difference of the target voltage and the charging voltage is equal to or less than the reference value. Thus, the charging ratio of the pixel may increase and the image quality of the display device may improve.

The exemplary embodiments may be applied to a display device and an electronic device having the display device. For example, the exemplary embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a plurality of first and second scan lines, a plurality of data lines, a plurality of sensing lines, and a plurality of pixels;
   a data driver to apply a reference data voltage to the data lines and change a voltage level of the reference data voltage based on compensating data;
   a scan driver to apply a first scan voltage to the first scan lines and a second scan voltage to the second scan lines;
   a timing controller to generate control signals that control the data driver and the scan driver; and
   a charging ratio compensator to:
      sense a target voltage charged in a first pixel of the plurality of pixels to which the reference data voltage is provided during a predetermined target time,
      sense a charging voltage charged in the first pixel to which the reference data voltage is provided during a charging time, and
      output the compensating data that changes the voltage level of the reference data voltage applied to the pixel during the charging time until a difference between the target voltage and the charging voltage is substantially equal to or less than a predetermined reference value,
   wherein the charging time is substantially the same as a data writing time of a horizontal period, and
   wherein the target time is longer than the charging time.

2. The display device of claim 1, wherein the charging ratio compensator stores the reference data voltage as a correction data voltage when the difference of the target voltage and the charging voltage is less than the reference value.

3. The display device of claim 1, wherein the charging ratio compensator comprises:
   a sensor to sense the target voltage and the charging voltage through the sensing line;
   a calculator to compare the difference of the target voltage and the charging voltage to the reference value;
   a controller to output the compensating data based on comparing a result of the difference between the target voltage and the charging voltage to the reference value; and
   a storage unit to store a correction data voltage based on comparing the result of the difference between the target voltage and the charging voltage to the reference value.

4. The display device of claim 3, wherein the controller outputs the compensating data that changes the voltage level of the reference data voltage applied during the charging time when the difference of the target voltage and the charging voltage is substantially equal to or greater than the reference value.

5. The display device of claim 3, wherein the storage unit stores the reference data voltage as the correction data voltage when the difference of the target voltage and the charging voltage is less than the reference value.

6. The display device of claim 5, wherein the storage unit stores the correction data voltage corresponding to at least some grayscales.

7. The display device of claim 1, wherein the first pixel includes a plurality of sub-pixels, and the sub-pixels are coupled to a same one of the sensing lines.

8. The display device of claim 1, wherein the first pixel includes:
   a switching transistor to transfer a data voltage based on a first scan signal;
   a storage capacitor to store the data voltage;
   a driving transistor to generate a driving current based on the data voltage;
   an organic light emitting diode to emit light based on the driving current; and
   a sensing transistor coupled between the storage capacitor and the sensing line, the sensing transistor configured to turn on or turn off based on a second scan signal.

9. The display device of claim 8, wherein the data line and a gate electrode of the driving transistor are initialized in a first initialization period and an anode electrode of the organic light emitting diode is initialized during a second initialization period.

10. The display device of claim 9, wherein the switching transistor is configured to turn on during the first initialization period,
    wherein the sensing transistor is configured to turn on during the second initialization period, and
    wherein a predetermined initialization voltage is applied through the data line during the first initialization period and the second initialization period.

11. The display device of claim 8, wherein the reference data voltage is applied to the first pixel through the data line during a first data writing period that is substantially the same as the target time, and
    wherein the reference voltage is applied to the first pixel through the data line during a second data writing period that is substantially the same as the charging time.

12. The display device of claim 11, wherein the switching transistor is configured to turn on during the first data writing period and the second data writing period, and
    wherein the reference data voltage is applied through the data line during the first data writing period and the second data writing period.

13. The display device of claim 8, wherein the charging ratio compensator is configured to sense the target voltage and the charging voltage charged in the storage capacitor through the sensing line during a sensing period.

14. The display device of claim 13, wherein the switching transistor is configured to turn off during the sensing period.

15. The display device of claim 1, wherein the charging ratio compensator is configured to operate when power to the display device turns off.

16. A method for improving image quality of a display device, the method comprising the steps of:
- applying a predetermined reference data voltage to pixels included in a display panel during a predetermined target time;
- sensing a target voltage charged in the pixels;
- applying the reference data voltage to the pixels during a charging time;
- sensing a charging voltage charged in the pixel;
- comparing a difference between the target voltage and the charging voltage to a predetermined reference value;
- outputting a compensating data that changes a voltage level of the reference data voltage applied during the charging time when the difference between the target voltage and the charging voltage is substantially equal to or greater than the reference value; and
- storing the reference data voltage as a correction data voltage when the difference between the target voltage and the charging voltage is less than the reference value,
- wherein the charging time is substantially the same as a data writing time of a horizontal period, and
- wherein the target time is longer than the charging time.

17. The method of claim 16, further comprising the step of:
- initializing the pixels.

18. The method of claim 16, wherein correction data voltages corresponding to each grayscale are stored.

* * * * *